United States Patent
Chiou et al.

(10) Patent No.: US 6,849,549 B1
(45) Date of Patent: Feb. 1, 2005

(54) METHOD FOR FORMING DUMMY STRUCTURES FOR IMPROVED CMP AND REDUCED CAPACITANCE

(75) Inventors: Wen-Chih Chiou, Miaoli (TW); Syun-Ming Jang, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 10/728,999

(22) Filed: Dec. 4, 2003

(51) Int. Cl.[7] .............................................. H01L 21/302
(52) U.S. Cl. ...................... 438/692; 438/618; 438/638; 438/687; 438/701; 438/725; 438/926
(58) Field of Search .................... 438/618, 638, 438/687, 692, 701, 725, 926

(56) References Cited

U.S. PATENT DOCUMENTS 6,001,733 A * 12/1999 Huang et al. ................ 438/633
6,214,745 B1 * 4/2001 Yang et al. .................. 438/759

* cited by examiner

*Primary Examiner*—George A. Goudreau
(74) *Attorney, Agent, or Firm*—Tung & Associates

(57) ABSTRACT

A method for forming a damascene structure to improve a chemical mechanical polishing (CMP) process while reducing the capacitance in an integrated circuit including forming a shallow dummy damascene adjacent active damascenes and removing the dummy damascene in a CMP process while forming the adjacent active damascenes.

26 Claims, 3 Drawing Sheets

US 6,849,549 B1

METHOD FOR FORMING DUMMY STRUCTURES FOR IMPROVED CMP AND REDUCED CAPACITANCE

FIELD OF THE INVENTION

This invention generally relates to methods for forming metal filled semiconductor features and more particularly to a method for forming dummy structures in active device areas to improve a chemical mechanical polish (CMP) process while avoiding an increase in multi-level integrated circuit device capacitance.

BACKGROUND OF THE INVENTION

Sub-micron multi-level metallization is one of the key technologies for the next generation of ultra large scale integration (ULSI). The multi-level interconnects that lie at the heart of this technology require planarization of interconnect features formed in high aspect ratio openings, including contacts, vias, metal interconnect lines and other features. Reliable formation of these interconnect features is very important to the success of ULSI and to the continued effort to increase circuit density and quality on individual substrates and die.

Copper and copper alloys have become the metal of choice for filling sub-micron, high aspect ratio interconnect features in multi-level IC semiconductor devices. Copper and its alloys have lower resistivity and higher electromigration resistance compared to other metals such as, for example, aluminum. These characteristics are critical for achieving higher current densities increased device speed.

As circuit densities increase, the widths of vias, contacts, metal interconnect lines, and other features, decrease to sub-micron and nanometer dimensions the capacitance of the various levels of the multi-level IC device becomes more critical, high capacitances lowering signal transport speed. Related to the capacitance of a particular level of a multi-level IC device are the dielectric constants of the various dielectric layers. In addition parasitic capacitances can be added by metal filled features that are adjacent to one another. In this respect, as critical dimensions have been reduced to sub-quarter micron, and more recently less than about 0.1 micron, low-K (low dielectric constant) dielectric insulating layers, for example having a dielectric constant of less than about 3.0, are required to achieve acceptable signal transport speeds.

The use of copper to decreases IC wiring resistances and the use of low-K materials, has contributed to new challenges in IC device manufacturing. For example, CMP planarization of copper filled features, in conjunction with low-K material layers leads to preferential polishing rates depending on the density of the patterned copper features present in a particular area of the process wafer surface. For example, a high feature pattern density portion of a process wafer surface tends to polish faster than a relatively lower feature pattern density portion leading to irregularities in surface topography. Such surface irregularities can adversely affect subsequent processes, leading to IC wiring failures and defects.

While the addition of dummy metal filled features to equalize pattern densities and therefore CMP polishing rates across the process wafer surface have been proposed in the prior art, such dummy metal filled features have the offsetting shortcoming of increasing the capacitance of a particular layer in a multi-level IC device. Increased capacitances can degrade IC device performance by slowing signal transport speeds, which is especially detrimental to high speed IC devices.

There is therefore a need in the integrated circuit processing art to develop a method of improving the uniformity of polishing in CMP processes while avoiding increased capacitance in multi-level IC semiconductor devices.

It is therefore an object of the invention to provide a method of improving the uniformity of polishing in CMP processes while avoiding increased capacitance in multi-level IC semiconductor devices, in addition to overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a damascene structure to improve a chemical mechanical polishing (CMP) process while reducing the capacitance in an integrated circuit.

In a first embodiment, the method includes providing a semiconductor substrate comprising a dielectric insulating layer including a first damascene opening; blanket depositing a first resist layer to fill the first damascene opening and patterning the first resist layer to form an etching mask for etching a dummy damascene opening adjacent the first damascene opening; etching the dummy damascene opening through a thickness portion of the dielectric insulating layer; blanket depositing a bottom anti-reflective coating (BARC) layer to include filling the dummy damascene opening; forming a second damascene opening through a thickness portion of the dielectric insulating layer to at least partially encompass the first damascene opening; removing the BARC layer to exposed the dummy damascene opening; forming a metal layer to include filling the first and second damascene openings and the dummy damascene opening; and, planarizing the metal layer according to a CMP process to include removing a portion of the dielectric insulating layer greater than the dummy damascene opening depth to remove the dummy damascene.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention is explained with reference to the formation of copper filled single and dual damascene structures. It will be appreciated however that the method of the present invention is applicable in general to metal filled damascene features including e.g., aluminum, tungsten, and alloys thereof where a chemical mechanical polish (CMP) planarization process is used to planarize the process surface following a metal filling process. It will be appreciated that although the method of the present invention is explained in exemplary implementation with respect to the manufacture of an exemplary level of a semiconductor device, the method may be repeated in each level of the multi-level device. The term 'copper' as used herein refers to copper and alloys thereof.

Figure 1A:
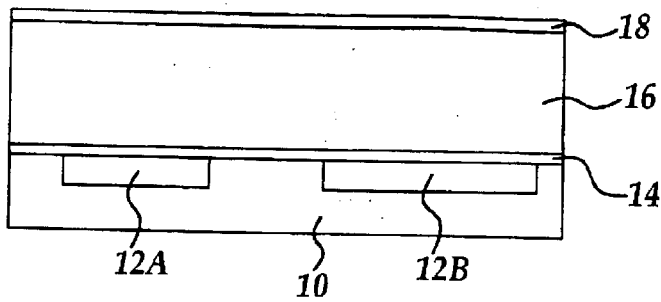
FIGS. 1A–1H are cross-sectional views of a portion of multi-level integrated circuit semiconductor device showing stages in manufacture according to an embodiment of the present invention.

Referring to FIG. 1A is shown a cross sectional view of a portion of a multi-level integrated circuit device, having conductive portions e.g., 12A and 12B, e.g., copper metal damascenes, for example interconnect lines formed in dielectric insulating layer 10. The copper metal damascene interconnect lines are formed by conventional processes including barrier layers (not shown) lining the interface of the dielectric insulating layer 10 and the copper metal interconnect lines 12A and 12B. An etch stop layer 14 is then formed over dielectric insulating layer 10 formed of, for example silicon nitride (e.g., SiN, $Si_3N_4$) or silicon carbide (e.g., SiC) by conventional CVD processes, for example, LPCVD or PECVD.

Still referring to FIG. 1A, formed over first etching stop layer 14 is dielectric insulating layer 16, for example an inter-metal dielectric (IMD) layer, preferably formed of a low-K dielectric material, for example a silicon oxide based material having a porous structure such as carbon doped oxide and organo-silicate glass (OSG). By the term 'low-K' is meant having a dielectric constant less than about 3.0, preferably less than about 2.7. The dielectric insulating layer 16 may be formed by a CVD process, for example LPCVD or PECVD, including organo-silane precursors such methylsilanes, or organo-siloxane precursors such as cyclo-tetra-siloxanes. It will be appreciated that inorganic or organic spin-on glasses (SOG) may also be used as are known in the art, for example including organo-silane or organo-siloxane precursors which are spun on the substrate by conventional methods followed by a curing process including optional post curing thermal and plasma treatments.

Although not shown, a middle etch stop layer, for example formed of silicon nitride or silicon carbide may be formed in the middle portion of IMD layer 16 to separate an upper trench line portion and a lower via portion of the IMD layer.

Still referring to FIG. 1A, one or more dielectric anti-reflective coating (DARC) layers e.g., layer 18, preferably a single inorganic layer functioning as both a hard mask and a anti-reflective coating, for example formed of silicon oxynitride or silicon oxycarbide, is deposited by an LPCVD or PECVD process over the IMD layer 16 at an appropriate thickness depending on the wavelength of reflected light to be suppressed in a subsequent photolithographic patterning process.

Figure 1B:
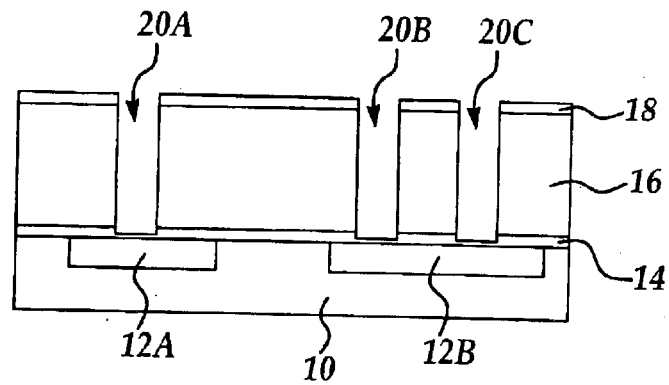

Referring to FIG. 1B, conventional photolithographic and etching processes, preferably using a DUV photoresist, is then carried out to form first damascene openings, for example via openings e.g., 20A, 20B and 20C. For example, the via openings are formed by first dry etching through the DARC layer e.g., 18 followed by dry etching through the thickness of the IMD layer 16, and through the thickness of etch stop layer 14 using conventional dry (e.g., reactive ion etch) etching chemistries in a multi-step etching process.

Figure 1C:
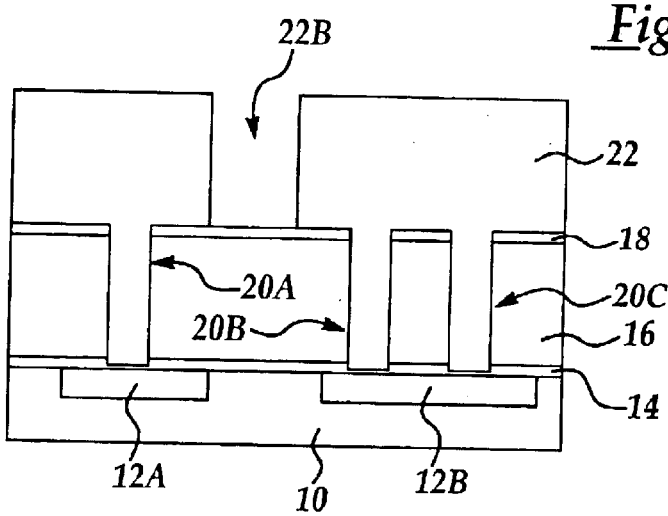

Referring to FIG. 1C, according to an aspect of the invention a first resist layer 22, for example a conventional I-line Novolac resist or DUV resist is blanket deposited over the via openings to include filling the via openings e.g., 20A, 20B and 20C. A conventional photolithographic patterning process is then carried out to form openings in resist layer 22, e.g., 22B, for forming shallow dummy trench openings according to an aspect of the invention, preferably disposed over a portion of the process surface having a relatively lower density of damascene features, for example, between via opening (e.g., isolated via) 20A and via opening 20B.

Figure 1D:
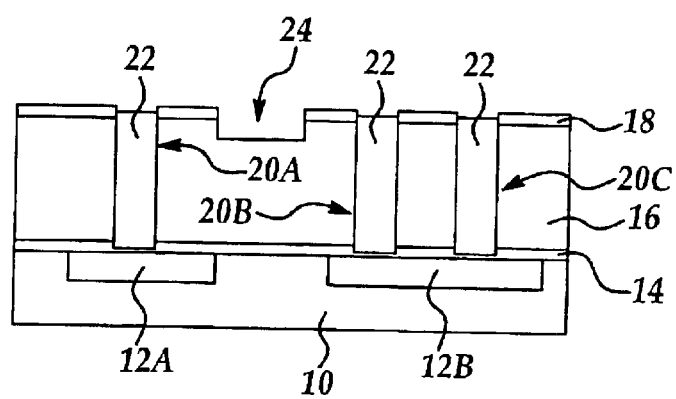

Referring to FIG. 1D, in an important aspect of the invention, a dry etchback process is then carried out to simultaneously remove the resist layer 22 above the damascene level while etching through the thickness of the DARC layer 18 and into a thickness portion of the of the IMD layer 16 to form dummy trench opening 24. For example, an etching chemistry including fluorocarbons and/or perfluorocarbons together with oxygen, and optionally nitrogen, is preferably used in the dry etchback process.

In an important aspect of the invention, the depth of the shallow dummy damascene trench opening 24 formed in the etchback process is less than the depth of a subsequently formed active second damascene portion, for example a trench forming an upper portion of an adjacent active dual damascene feature, e.g., formed overlying one or more of the via openings, e.g., 20A, 20B and 20C. For example, the depth of the shallow dummy damascene trench opening 24 is preferably less than about 2000 Angstroms, preferably having a sufficient depth such that following a subsequent metal filling process and a CMP process, the metal filled shallow dummy damascene trench e.g., 24 is eliminated (polished back) by the CMP process while leaving second damascene portions to form adjacent active dual damascene trench portions to a desired thickness as shown further below.

It will be appreciated that the thickness of the IMD layer 16, is preferably formed to a sufficient thickness, for example between about 8000 to about 15000 Angstroms to allow formation of the dummy shallow trench (damascene) and subsequent polishing back of the IMD layer of up to about 2000 Angstroms in a CMP process to remove the metal filled shallow dummy damascene trench e.g., 24 and form desired final depths of adjacent active single or dual damascene structures.

Figure 1E:
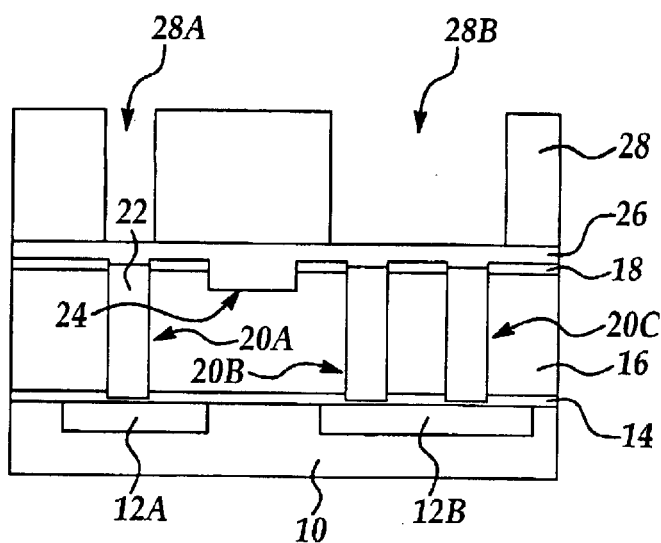

Referring to FIG. 1E, a bottom anti-reflective coating (BARC) layer 26 is next blanket deposited over the process wafer surface to including filling the shallow dummy trench opening 24. The BARC layer 26 may be formed of an inorganic or organic material as are known in the art, including spin-on glass (SOG) or spin on dielectric (SOD) materials, but is preferably formed of a polymeric organic material removable by an ashing and/or wet stripping process.

Still referring to FIG. 1E, a second resist layer 28, preferably a DUV photoresist is deposited and patterned to form a patterned openings e.g., 28A and 28B overlying one or more of the via openings, e.g., 20A, 20B and 20C, but left covering the shallow dummy damascene opening 24.

Figure 1F:
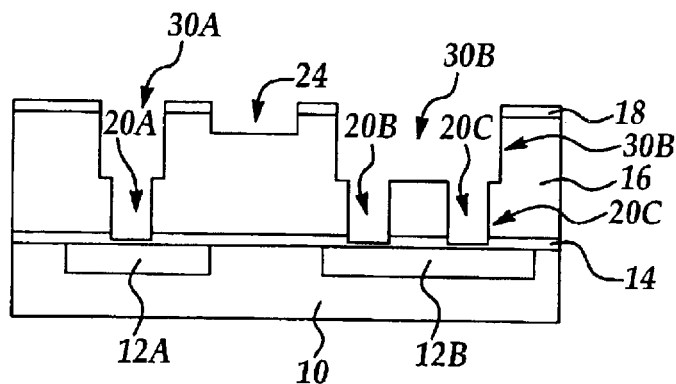

Referring to FIG. 1F, a conventional dry (RIE) etching process is then carried out to etch through a thickness portion of the BARC layer 26, the DARC layer 18, and through a thickness portion of the IMD layer 16, to form a second damascene openings e.g., 30A and 30B, for example a trench portion, overlying one or more vias, e.g., 20A and 20B, 20C, respectively, to form dual damascene openings. Following the etching process, remaining portions of the resist layers 22, 28 and the BARC layer 26 are removed by a dry etchback process and/or a wet stripping process. The BARC layer 26 may be removed by a CMP process if it is a dielectric material.

Figure 1G:
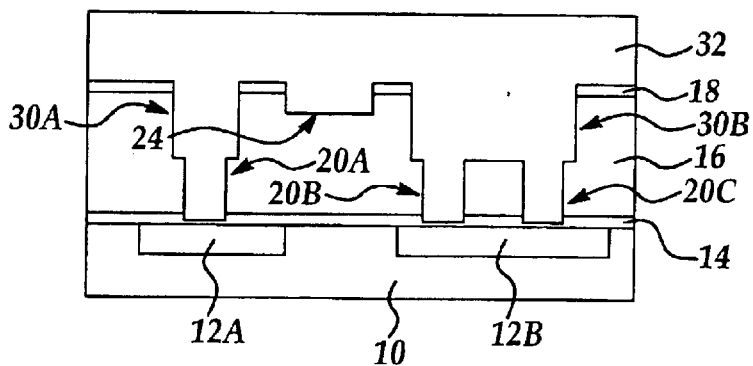

Referring to FIG. 1G, conventional metal filling processes are then carried out, for example by first depositing a barrier layer (not shown) e.g., Ta, TaN, Ti, TiN, WN, Cr, CrN, TaSiN, TiSiN, and WSiN, to line the damascene openings e.g., 20A, 20B, 20C, 30A, and 30B followed by a metal filling process, for example an electrochemical deposition (ECD) process to deposit a copper filling layer e.g., 32, preceded by depositing a PVD or CVD copper seed layer (not shown).

Figure 1H:
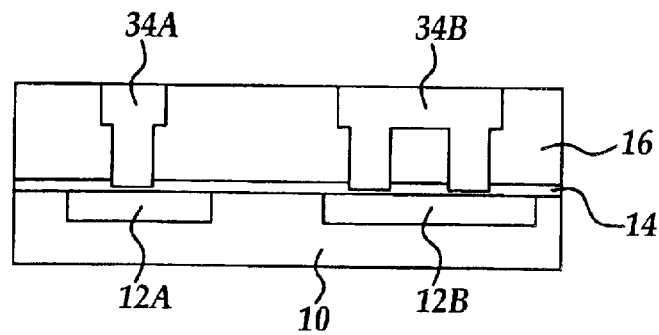

Referring to FIG. 1H, in an important aspect of the invention, a CMP polishing process is then carried out to remove excess copper of copper layer 32 overlying the damascene opening levels including removing the DARC layer 18, and a predetermined thickness portion of the IMD layer 16 sufficient to remove the metal filled shallow dummy damascene 24. For example the completed metal filled damascene structures, e.g., 34A and 34B are formed to a desired final depth, while the shallow dummy metal damascene formed by filling opening 24 is removed. Advantageously, during the CMP process, the metal filled shallow dummy damascenes improve the polishing uniformity of the CMP polishing process, and consequently the planarity of the process surface topography. Preferably, the CMP polishing process is carried out such that a portion of the IMD layer 16, is removed including about a depth greater than the depth of the shallow dummy damascene 24, e.g., up to about 2000 Angstroms, to remove the shallow dummy damascene 24.

Figure 2:
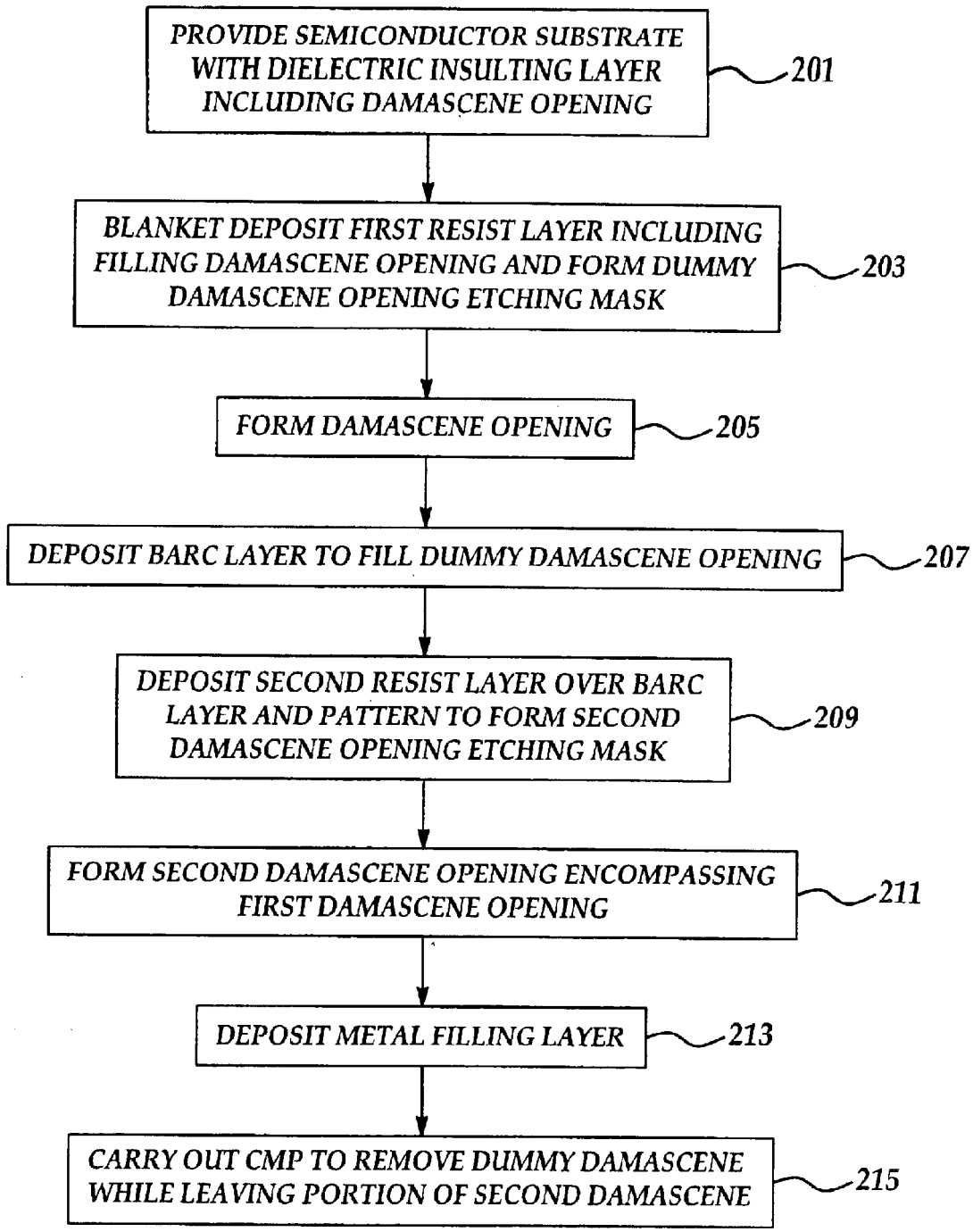
FIG. 2 is a process flow diagram including several embodiments of the present invention.

Referring to FIG. 2 is shown a process flow diagram including several embodiments of the present invention. In process 201, active damascene openings are provided extending through a thickness of at least one dielectric insulating layer. In process 203, a first resist layer is blanket deposited to include filling the damascene openings and patterned to form a shallow trench dummy damascene opening etching mask adjacent active damascene openings. In process 205, a dry etchback process is carried out to simultaneously etchback the first resist layer while etching shallow trench dummy damascene openings according to preferred embodiments into the dielectric insulating layer. In process 207, a BARC layer is blanket deposited to include filling the shallow trench dummy damascene openings. In process 209, a second resist layer is blanket deposited and patterned to form an active trench etching mask. In process 211, a conventional dry etching process is carried out to etch active trenches overlying one or active damascene openings according to preferred embodiments. In process 213, after removing the remaining first, second resist and BARC layer portions a metal layer to fill the first, second and dummy damascene openings is blanket deposited. In process 215, a CMP process is carried out to remove excess metal above the damascene level including removing a thickness portion of the dielectric insulating layer extending greater than a thickness of the shallow trench dummy damascene openings to remove the shallow trench dummy damascene openings while leaving a portion of the second damascene openings.

Thus, a method has been presented for forming metal damascenes including dummy metal damascenes to improve a CMP planarization process following a metal filling process. Advantageously, preferential polishing in areas of relatively higher or lower feature density is avoided thereby improving the planarity of the process surface topography. Moreover, the thickness of the dielectric insulating layer is selected and the post metal-filling CMP planarization process is carried out to remove the dummy damascenes during the CMP process thereby advantageously reducing the capacitance of an integrated circuit level in a multi-level integrated circuit. The method is particularly advantageous for sub-quarter micron critical dimensions, including less than about 0.1 micron, particularly 0.9 micron technologies and below.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a damascene structure to improve a chemical mechanical polishing (CMP) process while reducing the capacitance in an integrated circuit comprising the steps of:

providing a semiconductor substrate comprising a dielectric insulating layer including a first damascene opening;

blanket depositing a first resist layer to fill the first damascene opening and patterning the first resist layer to form an etching mask for etching a dummy damascene opening adjacent the first damascene opening;

etching the dummy damascene opening into a thickness portion of the dielectric insulating layer;

blanket depositing a bottom anti-reflective coating (BARC) layer to include filling the dummy damascene opening;

forming a second damascene opening through a thickness portion of the dielectric insulating layer to at least partially encompass the first damascene opening;

removing the BARC layer to exposed the dummy damascene opening;

forming a metal layer to include filling the first and second damascene openings and the dummy damascene opening; and, planarizing the metal layer according to a CMP process to include removing a portion of the dielectric insulating layer greater than the dummy damascene opening depth to remove the dummy damascene.

2. The method of claim 1, wherein the step of forming a second damascene opening comprises depositing and patterning a second resist layer to form an etching mask for etching the second damascene opening.

3. The method of claim 2, wherein the second resist layer comprises a deep ultraviolet (DUV) photoresist.

4. The method of claim 1, wherein the first and second damascene openings are selected from the group consisting of a via opening and a trench opening.

5. The method of claim 1, wherein the second damascene opening comprises a trench portion of a dual damascene structure.

6. The method of claim 1, wherein the second damascene opening is formed to a depth greater than the dummy damascene opening.

7. The method of claim 1, wherein the first damascene opening is a via opening.

8. The method of claim 1, wherein the BARC layer is selected from the group consisting of a resinous polymer, a spin-on glass, a spin-on dielectric, and a CVD dielectric.

9. The method of claim 1, wherein the semiconductor substrate further comprises a dielectric anti-reflectance coating (DARC) layer overlying the dielectric insulating layer.

10. The method of claim 1, wherein the first damascene opening comprises one of a diameter or width less than about 0.25 microns.

11. The method of claim 1, wherein the metal layer is selected from the group consisting of tungsten aluminum, copper and alloys thereof.

12. The method of claim 1, wherein the metal layer comprises copper and alloys thereof.

13. The method of claim 1, wherein the dielectric insulating layer comprises a low-K silicon oxide based material.

14. The method of claim 1, wherein the dielectric insulating layer is selected from the group consisting of organo-silicate glass, and carbon doped silicon oxide.

15. A method for forming a dummy damascene structure to improve a chemical mechanical polishing (CMP) process while reducing the capacitance in a multi-level integrated circuit comprising the steps of:

forming a first via opening through a thickness portion of a dielectric insulating layer having an overlying dielectric anti-reflectance coating (DARC) layer;

blanket depositing a first resist layer to fill the damascene opening and patterning the first resist layer to form an etching mask for etching a dummy damascene opening adjacent the via opening;

etching the dummy damascene opening through a thickness portion of the dielectric insulating layer to a first depth;

blanket depositing a bottom anti-reflective coating (BARC) layer to include filling the dummy damascene opening;

forming a damascene opening to a second depth greater than the first depth through a thickness portion of the dielectric insulating layer to at least partially encompass the via opening;

removing the BARC layer to exposed the dummy damascene opening;

forming a metal layer to include filling the via opening, damascene opening, and the dummy damascene opening; and, planarizing the metal layer according to a CMP process to include removing a portion of the dielectric insulating layer greater than the dummy damascene opening depth to remove the dummy damascene.

16. The method of claim 15, wherein the step of forming a damascene opening comprises depositing and patterning a second resist layer to form an etching mask for etching the damascene opening.

17. The method of claim 16, wherein the second resist layer comprises a deep ultraviolet (DUV) photoresist.

18. The method of claim 15, wherein the damascene opening is selected from the group consisting of a via opening and a trench opening.

19. The method of claim 15, wherein the damascene opening comprises a trench portion of a dual damascene structure.

20. The method of claim 15, wherein the BARC layer is selected from the group consisting of a resinous polymer, a spin-on glass, a spin-on dielectric, and a CVD dielectric.

21. The method of claim 15, wherein the via opening comprises a diameter of less than about 0.25 microns.

22. The method of claim 15, wherein the metal layer is selected from the group consisting of tungsten aluminum, copper and alloys thereof.

23. The method of claim 15, wherein the metal layer comprises copper and alloys thereof.

24. The method of claim 15, wherein the dielectric insulating layer comprises a low-K silicon oxide based material.

25. The method of claim 15, wherein the dielectric insulating layer is selected from the group consisting of organo-silicate glass, and carbon doped silicon oxide.

26. A method for forming a dummy damascene structure to improve a chemical mechanical polishing (CMP) process while reducing the capacitance in a multi-level integrated circuit comprising the steps of:

forming a first damascene opening through a thickness portion of a dielectric insulating layer;

forming a dummy damascene opening adjacent the first damascene opening through a thickness portion of the dielectric insulating layer to a first depth;

forming a second damascene opening to a second depth greater than the first depth through a thickness portion of the dielectric insulating layer to at least partially encompass the via opening;

forming a metal layer to include filling the first and second damascene openings and the dummy damascene opening; and, planarizing the metal layer according to a CMP process to include removing a portion of the dielectric insulating layer greater than the dummy damascene opening depth to remove the dummy damascene while leaving a portion of the second damascene opening.

* * * * *